US010673138B2

(12) United States Patent
Freyssinier et al.

(10) Patent No.: US 10,673,138 B2
(45) Date of Patent: Jun. 2, 2020

(54) METHOD FOR CALIBRATING AN ELECTRONICALLY SCANNED SECTOR ANTENNA AND CORRESPONDING MEASURING DEVICE

(71) Applicant: THALES, Courbevoie (FR)

(72) Inventors: Philippe Freyssinier, Elancourt (FR); Frédéric LeClerc, Elancourt (FR); Alain Adamjee, Elancourt (FR); Christian Renard, Elancourt (FR); Pierre Levy, Elancourt (FR)

(73) Assignee: THALES, Courbevoie (FR)

( * ) Notice: Subject to any disclaimer, the term of this patent is extended or adjusted under 35 U.S.C. 154(b) by 200 days.

(21) Appl. No.: 15/753,952

(22) PCT Filed: Sep. 30, 2016

(86) PCT No.: PCT/EP2016/073418
§ 371 (c)(1),
(2) Date: Feb. 20, 2018

(87) PCT Pub. No.: WO2017/060170
PCT Pub. Date: Apr. 13, 2017

(65) Prior Publication Data
US 2018/0248262 A1  Aug. 30, 2018

(30) Foreign Application Priority Data

Oct. 7, 2015  (FR) ..................... 15 02084

(51) Int. Cl.
*H01Q 3/26* (2006.01)
*G01S 7/40* (2006.01)
(Continued)

(52) U.S. Cl.
CPC ............. *H01Q 3/267* (2013.01); *G01R 29/10* (2013.01); *G01S 7/4021* (2013.01);
(Continued)

(58) Field of Classification Search
CPC ....... H01Q 3/267; G01S 7/4021; G01S 13/44; G01S 7/4026; G01S 2013/0254; G01R 29/10
(Continued)

(56) References Cited

U.S. PATENT DOCUMENTS 4,499,472 A * 2/1985 Willett ..................... G01S 3/023
342/374
6,133,868 A * 10/2000 Butler ..................... H01Q 3/267
342/165
(Continued)

FOREIGN PATENT DOCUMENTS

FR  2 949 610 A1  3/2011
FR  3 015 129     6/2015
(Continued)

OTHER PUBLICATIONS

Translation of WIPO Search Opinion in PCT/EP2016/073418 dated Dec. 9, 2016 (Year: 2016).*
(Continued)

*Primary Examiner* — Frank J McGue
(74) *Attorney, Agent, or Firm* — Baker & Hostetler LLP

(57) ABSTRACT

An electronic-scanning antenna composed of radiating elements each forming an active channel in which the signals arising from the channels are grouped together to form deviometry signals, each deviometry signal forming a deviometry channel, and are grouped together according to sectors to form a sector-based signal forming a sector channel, a computation-based beam being formed on the basis of the signals arising from each of the sectors, the method comprises the following steps: measuring the response to a calibration signal of each active channel at one
(Continued)

and the same time on the sum deviometry channel and on the sector channel to which it belongs, the responses on the sum channel to obtain the calibration of the sum channel; computing, for each active channel, the disparity between the mean of the responses measured on the sum channel and the mean of the responses measured on the sector to which it belongs; in the operational phase, forming the beam by computation on the basis of the measurements of the signals arising from the sector channels calibrated with the calibration obtained for the sum channel, and correcting the computation of the beam as a function of the disparity.

9 Claims, 2 Drawing Sheets

(51) Int. Cl.
  *G01R 29/10* (2006.01)
  *G01S 13/44* (2006.01)
  *G01S 13/02* (2006.01)
(52) U.S. Cl.
  CPC ............ *G01S 7/4026* (2013.01); *G01S 13/44* (2013.01); *G01S 2013/0254* (2013.01)
(58) Field of Classification Search
  USPC ......................................................... 342/174
  See application file for complete search history.

(56) References Cited

U.S. PATENT DOCUMENTS

| | | | |
|---|---|---|---|
| 6,294,952 B1* | 9/2001 | Kato | H03D 1/2245 |
| | | | 329/306 |
| 2003/0184473 A1 | 10/2003 | Yu | |
| 2006/0058022 A1* | 3/2006 | Webster | H01Q 3/267 |
| | | | 455/423 |
| 2011/0248796 A1 | 10/2011 | Pozgay | |
| 2018/0248262 A1* | 8/2018 | Freyssinier | G01S 7/4026 |

FOREIGN PATENT DOCUMENTS

| | | |
|---|---|---|
| JP | 2001-201525 A | 7/2001 |
| WO | 2013/053706 A1 | 4/2013 |

OTHER PUBLICATIONS

R. Medina et al., "Calibration and validation of the CASA phased array antenna," 2012 9th European Radar conference, Oct. 31, 2012, pp. 614-617, XP032326785.
C. Renard, "Calibration et mesure faible coût d'une antenne à balayage électronique active," (Low-cost calibration and measurement of an active electronic-scanning antenna) CNES Workshop, Dec. 1998.
E. Grorud et al., "Design and Measurement of an active array antenna for an airborne X-band SAR/MTI Radar," EUCAP Nice 2006.
C. Renard, "Etalonnage des antennes aéroportées," (Calibration of airborne antennas), CCT CNES Jan. 2009.

* cited by examiner

METHOD FOR CALIBRATING AN ELECTRONICALLY SCANNED SECTOR ANTENNA AND CORRESPONDING MEASURING DEVICE

CROSS-REFERENCE TO RELATED APPLICATIONS

This application is a National Stage of International patent application PCT/EP2016/073418, filed on Sep. 30, 2016, which claims priority to foreign French patent application No. FR 1502084, filed on Oct. 7, 2015, the disclosures of which are incorporated by reference in their entirety.

FIELD OF THE INVENTION

The present invention relates to a method for calibrating a sectorized active antenna. It also relates to a measurement device for the implementation of such a method.

The invention applies in particular to the field of electronic-scanning active antennas used in particular to equip radars or seekers of missiles and architectured in sectors to perform computational beamforming (CBF). More generally, it applies to any sectorized electronic-scanning antenna, whatever its application.

BACKGROUND

An electronic-scanning antenna is an antenna with an array of radiating elements which comprises electronic devices allowing changes of states of the shape of the transmitted beam. Depending on their nature, these electronic devices (phase-shifters, attenuators), which are connected to the N radiating elements so as to form N active channels, act on the shape, the direction, the frequency or the polarization of the wave formed.

An active electronic-scanning antenna corresponds to an antenna whose devices for amplifying the transmitted or received signals are included in the antenna and distributed as close as possible to the radiating elements, forming an array of active transmit and receive channels. Conventionally, in reception the signals arising from the N radiating elements are grouped together after amplification, weighting and phase-shifting by physical devices called distributers or summators so as to form four sectors of identical general shape commonly called "antenna quarters". These 4 quarters are thereafter combined together by a physical device incorporated into the antenna and called a "channel formatter" which forms the conventional deviometry channels used in radars or seekers in particular, these channels being the sum channel $\Sigma$, the bearing difference channel $\Delta B$ and the elevation difference channel $\Delta E$.

A sectorized active electronic-scanning antenna is an antenna which does not group the N radiating elements together directly to form the four sectors and then the conventional deviometry channels but performs M partial groupings thereof, each containing a certain number of channels. These partial groupings go by the name of sector channels and are available at antenna output. A sectorized antenna can continue to give access to the conventional deviometry channels as a supplement to the outputs of the sector channels. The deviometry signals are processed conventionally while the signals arising from the sectors are used by the system whatever it be (radar, seeker, . . . ) to form, by computation a certain number of channels: the conventional deviometry channels for example but also any other type of combination of the signals arising from the M sectors which are intended to improve the information processing. Thus, in addition to the formulation of the conventional deviometry channels, a sectorized antenna formulates output signals of sector channels corresponding to the partial and disjoint groupings of a certain number of active channels of the antenna. The fact of having access to these various sector signals makes it possible to recompose by computation a CBF signal according to all combinations of the type:

$$\text{Signal\_CBF} = \sum_{i=1}^{M} B_i e^{j\psi i} \cdot \text{Channel\_sector}(i) \tag{1}$$

where M is the number of sectors, Channel_sector(i) the signal arising from the sector of order i, and $B_i e^{j\psi i}$ a complex weight assigned to sector i. In practice M is a multiple of 4, M is for example equal to 16 or 32.

Hereinafter, equation (1) will be called the CBF equation.
Hereinafter also, the following terminology will be used:
Active channel: one of the N unitary channels of which the antenna is composed;
Conventional deviometry channel: one of the three deviometry channels conventionally formulated in a traditional electronic-scanning antenna;
Sector channel: one of the M sector channels formulated by a sectorized antenna;
Antenna Channel: generic term designating a sector channel or a conventional channel.

The adjustment of active antennas involves a so-called calibration phase which consists in measuring on the assembled antenna the dispersions of amplitude and of phase in transmission or reception on the N various active channels of the antenna, these dispersions being due in particular to the dispersions of the components included in the active channels as well as to the assemblage dispersions. These dispersions are thereafter compensated by appropriate corrections applied to the amplitude control and phase control of each active channel by virtue of the pointing computer. In the case of a conventional antenna, this calibration is traditionally done at the antenna output on the sum channel $\Sigma$.

Within the framework of a sectorized active antenna, the conventional deviometry channels and the sector channels must be optimized simultaneously, a problem which does not actually arise for a conventional antenna.

Once calibrated with the required precision, the active antennas, be they sectorized or not, have to be tested according to a certain number of parameters (patterns, EIRP, G/T, . . . ). In the case of a sectorized antenna, the number of measurements to be made is much more significant than for a conventional antenna and increases nearly in proportion to the number of sector channels.

Thus for a sectorized antenna, the following problems arise in an acute manner:
calibration of the antenna, since several Antenna channels have to be optimized simultaneously (the conventional channels and the various sector channels) in contradistinction to a conventional antenna where the calibration is generally performed on the sum channel $\Sigma$;
testing, since a lot of data must be measured:
with a precision at least equal, or indeed increased, with respect to a conventional antenna;
in a measurement time which is of the same class as for a conventional antenna so that the schedules of the test phases do not increase in duration.

Several documents deal with the calibration of conventional scanning antennas, this being the case in particular for the documents FR0904045, FR1103143 and FR1302928 as well as the documents by C. Renard: "Calibration et mesure faible coût d'une antenne à balayage électronique active"

[Low-cost calibration and measurement of an active electronic-scanning antenna] CNES Workshop, December 1998, by E.GRORUD et al. "Design and Measurement of an active array antenna for an airborne X-band SAR/MTI Radar", EUCAP Nice 2006 and by C. Renard: "Etalonnage des antennes aéroportées" [Calibration of airborne antennas], CCT CNES January 2009.

In the case of sectorized antennas, few or no satisfactory known solutions exist.

As regards the test measurements, the number of channels to be measured simultaneously in reception in a conventional electronic-scanning antenna is limited to the three conventional deviometry channels and the problem of the simultaneity of the measurements is conventionally solved:

either by using a multiport array analyzer capable of measuring these three conventional channels at the same time, the number of measurement ports of the analyzer not being able to be increased indefinitely and being limited in a standard manner to 8 currently;

or by multiplexing the three measurements on a conventional array analyzer comprising a reception port, the multiplexer being linked to the three outputs of the antenna to be measured and comprising switches making it possible to orient the desired channel.

The application of these schemes to an antenna that comprised for example 16 or 32 sectors to be tested in reception is not possible, either because the number of Antenna channels to be tested exceeds the simultaneous capacity of current array analyzers, or because of the trail effect in the case of multiplexed measurements. Indeed the antenna being in motion during the measurement, the Antenna channels are not all actually measured at the same location of the antenna pattern, this not being serious when the number of channels is low but which becomes crippling when the number of channels increases greatly, then causing the so-called "trail" effect.

Stopping the antenna, which is necessary for the time the measurement is being performed, leads to crippling measurement times and cannot be an acceptable solution either.

SUMMARY OF THE INVENTION

An aim of the invention is in particular to enable the CBF signals to be of the same quality as the conventional deviometry signals formulated by the antenna, and to do so in a sectorized-antenna calibration and measurement time comparable to that for a conventional electronic-scanning active antenna.

To this end, the subject of the invention is a method for calibrating an electronic-scanning antenna composed of radiating elements each forming an active channel in which the signals arising from said channels are grouped together on the one hand to form deviometry signals, each deviometry signal forming a deviometry channel, and are grouped together on the other hand according to sectors ($S_1, S_2, \ldots S_M$) to form a sector-based signal forming a sector channel, a computation-based beam being formed on the basis of the signals arising from each of said sectors, said method comprising at least the following steps:

measuring the response to a calibration signal of each active channel at one and the same time on the sum deviometry channel and on the sector channel to which it belongs, the responses on the sum channel making it possible to obtain the calibration of the sum channel;

computing, for each active channel, the disparity between the mean of the responses measured on the sum channel and the mean of the responses measured on the sector to which it belongs;

in the operational phase, forming said beam by computation on the basis of the measurements of the signals arising from the sector channels calibrated with the calibration obtained for the sum channel, and correcting the computation of said beam as a function of said disparity.

The measurement of the response to a calibration signal of each active channel at one and the same time on the sum deviometry channel and on the sector channel to which it belongs is for example performed in one and the same instantaneous measurement sequence.

The signal measurements arising from the sector channels are for example performed in one and the same instantaneous measurement sequence.

In a particular mode of implementation, the signal received by the beam formed by computation, denoted Signal_CBF, is obtained according to the following relation:

$$\text{Signal\_CBF} = \sum_{i=1}^{M} B_i e^{j\psi i} \cdot \text{Channel\_sector}(i) \cdot \text{Cor\_sector}(i)$$

where:
M is the number of sectors;
Channel_sector(i) is the measurement of the signal arising from the channel of the $i^{th}$ sector calibrated with the calibration obtained for the sum channel, i varying from 1 to M;
$B_i e^{j\psi i}$ is a complex weight assigned to the $i^{th}$ sector;
Cor_sector(i) represents the disparity between the mean of the responses measured on the sum channel and the mean of the responses measured on the $i^{th}$ sector.

The invention also relates to a measurement device for the implementation of said method, which comprises at least:

a multiport array analyzer comprising a total number P of receivers, said analyzer being able to measure the signals arising from said active channels in response to said calibration signal;

a set of K switches each having Q input channels and an output channel to which one of said input channels is wired, said switches being driven by said analyzer, said input channels being able to each receive a signal arising from an active channel of said antenna in response to said calibration signal, said output channels being linked to one of the P receivers; said analyzer triggering successively Q measurement according to the following sequence:

on reception of a measurement order signal, said analyzer driving said switches so that they each switch their first input channel onto their output channel and then triggering the measurement on its P receivers of the signals arising from P first active channels;

and then said analyzer driving said switches so that they each select their second input channel on their output channel, and then triggering the measurement on its P receivers of the signals arising from P following active channels;

and so on and so forth until said analyzer driving said switches makes them each wire up their $Q^{th}$ input channel to their output channel.

An amplifier is for example disposed between each switch output and the input of the receiver to which it is linked. A port of said analyzer comprises for example at least one transmit module for generating the transmit signal intended to be transmitted toward said channels.

Said device comprises for example a coupler at the output of said transmit module, said port comprising at least one receiver for receiving a reference signal arising from said transmit signal via said coupler. Said port comprises for example a second receiver receiving a signal arising from an array formed of a few radiating elements of said antenna.

BRIEF DESCRIPTION OF THE DRAWINGS

Other characteristics and advantages of the invention will become apparent with the aid of the description which follows, given in relation to appended drawings which represent.

DETAILED DESCRIPTION

Figure 1:
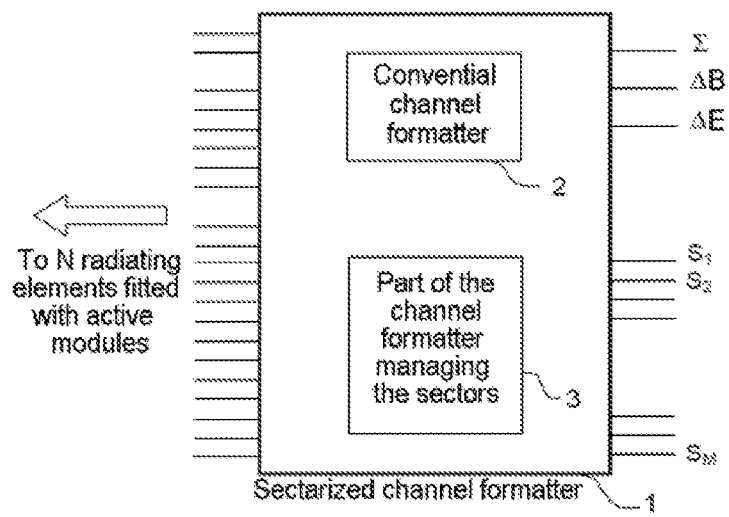
FIG. 1, an illustration of the principle of realization of a channel formatter used in a sectorized electronic-scanning antenna.

FIG. 1 illustrates the principle of realization of a channel formatter 1 used for a sectorized active electronic-scanning antenna.

In a conventional active antenna, the conventional deviometry channels $\Sigma$, $\Delta E$, $\Delta B$, are formed physically by the antenna through a channel formatter. The calibration measurement in respect of each active channel is made between the input of the radiating element and the output of the sum channel $\Sigma$ of the channel formatter in the calibration operation. The quality of the calibration on the $\Sigma$ channel associated with the precision of operation conventionally encountered in channel formatters suffices to guarantee correct operation of the set of three deviometry channels.

In the case of a sectorized antenna, the simultaneous formation of the conventional deviometry channels and of the sector channels is ensured by a specific-channels formatter presented schematically by FIG. 1. It comprises for example a formatter 2 of conventional channels which is intended for the formulation of the conventional deviometry channels $\Sigma$, $\Delta E$, $\Delta B$ and a part 3 which manages the sectors $S_1, S_2, \ldots S_M$.

Each active channel of the antenna arising from a radiating element emerges simultaneously on the conventional deviometry channels and on the output of the sector to which it belongs but the path that it follows is not the same. More precisely, the path difference between the sum channel $\Sigma$ and the sector channel is the same for all the active channels belonging to one and the same sector. The paths are common as far as the channel formatter 1 and differ thereafter inside this device 1.

If one chooses to continue to calibrate the antenna on the sum channel $\Sigma$ as on a conventional antenna, the corrections made during the pointing of the antenna lead to well-adjusted deviometry channels but the signals arising from the various sectors are not mutually coherent since the path disparity between the sum channel $\Sigma$ and the corresponding sector output is not the same from sector to sector. If one chooses to do the converse, that is to say to calibrate on the sector channels, the deviometry channels formed physically by the antenna are not good (regrowth of the sidelobes and axis deviation in particular) and therefore cannot be used.

This therefore constitutes a first problem encountered. The various antenna channels must indeed be optimized simultaneously.

Moreover, application of the CBF computation formula brings to light a need for increased precision in the measurement of the sectorized antenna with respect to a conventional antenna. Indeed, the summation of errors per antenna sector produces significant effects on the regrowth of the first sidelobes and on the axis deviation. This problem has no equivalent in conventional antennas which concentrate the efforts to be made on the physical devices for grouping the channels and not on the measurement.

Finally, the quantity of measurements to be performed in a sectorized antenna is nearly proportional to the number of sectors of the antenna while the development and test schedules for this type of antenna quite naturally imposes test timescales which are of substantially the same class as for conventional antennas.

As indicated previously, a problem posed is therefore to develop a calibration scheme making it possible to simultaneously optimize the conventional deviometry channels and the sector channels, with a corresponding test means whose main characteristics are very good measurement precision and a capacity to make a multiplicity of measurements in a time comparable with that required for a conventional antenna, 5 to 10 times as many measurements for example.

Figure 2:
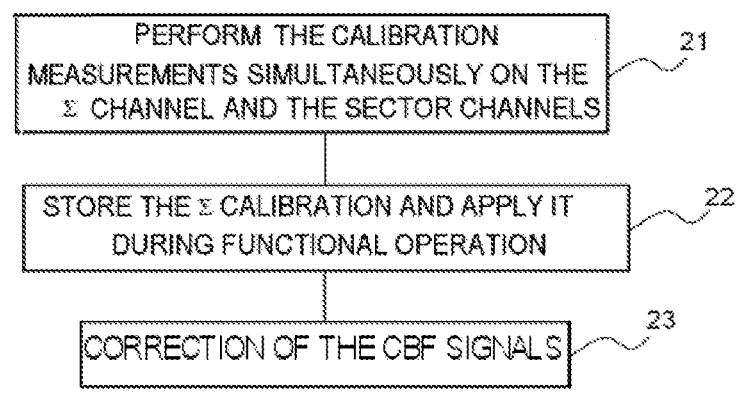
FIG. 2, various possible steps of the method according to the invention.

FIG. 2 illustrates the possible steps of the method according to the invention. These steps in fact carry out the following operations:

Undertake the calibration on the sum channel $\Sigma$ in a conventional manner to optimize the deviometry channels by virtue of the channel formatter inserted into the antenna;

Measure the defect in adjustment between the sum channel $\Sigma$ and the sector channels;

Correct the mutual composition of the sectors by a factor which compensates this differential adjustment defect.

Thus, in a first step 21, the calibration measurements are performed simultaneously on the sum channel $\Sigma$ and the sector channels. More precisely, to simultaneously optimize the antenna on the conventional deviometry channels and the sector channels serving for the computational beamforming CBF, the response of each active channel to a test signal is measured simultaneously, or almost simultaneously, at one and the same time on the sum channel $\Sigma$ and on the sector channel to which it belongs.

In a following step 22, the calibration on the sum channel $\Sigma$ is stored. More particularly this calibration takes the form of a table, consisting of the measurements of the responses of each active channel to the test signal, is for example stored in the pointer of the antenna just as for conventional antennas. This calibration is applied to the antenna. Under these conditions the functional operation of the antenna is optimized on its deviometry channels but not on its sector channels. In this step also, the difference between the calibration table of the sum channel $\Sigma$ and the calibration table on the sector channels is stored. The calibration table of a sector consists, for each sector, of the responses of each active channel belonging to this sector. The calibration table on the sector channels groups together the set of calibration tables of the sectors. In the current art, these calibrations on the sector channels do not allow optimized operation on these sector channels.

According to the invention, the CBF equation defined by claim 1 is modified as a function of this difference between the tables.

In a following step 23, a correction is therefore determined to be performed on the CBF signals in the operational phase, that is to say when the antenna is in operation. More precisely, one determines the correction to be applied to the signals obtained according to the CBF equation defined by relation (1). With this correction, a CBF signal is obtained according to the following relation (2):

$$\text{Signal\_CBF} = \sum_{i=1}^{M} B_i e^{j\psi i} \cdot \text{Channel\_sector}(i) \cdot \text{Cor\_sector}(i)$$

Just as for relation (1), $B_i e^{j\psi i}$ is a complex weight assigned to sector i.

Channel_sector(i) is the measurement of the signal at the output of sector i in response to the test signal on the basis of which the calibration of the sum channel Σ is performed. It is therefore a non-optimized measurement in respect of the calibration of the CBF signal.

The signal Cor_sector(i), of each sector i, makes it possible to optimize the CBF signal, that is to say the calibration. It corresponds to the disparity between the calibration of an active channel on the sum channel Σ, Cal_channelΣ(i), and the calibration of this active channel on the sector i to which it belongs, Cal_sector(i). More precisely, the quantities Cal_channelΣ(i) and Cal_sector(i) are averaged over the set of active channels belonging to one and the same sector i:

$$\text{Cor\_sector}(i) = \overline{\text{Cal\_channel}\Sigma(i)} - \overline{\text{Cal\_channel}\Sigma(i)} \quad (3)$$

In the corrected CBF equation of relation (2), it is necessary to be able to measure the elements Cor_sector(i), and Channel_sector(i) with very good precision so that the contribution of the measurement errors to the weighted summation of the sectors is negligible.

A device according to the invention advantageously enables these accuracy levels desired in the CBF equation to be attained, both for the correction term and for the actual measurement of the sector channels.

Figure 3:
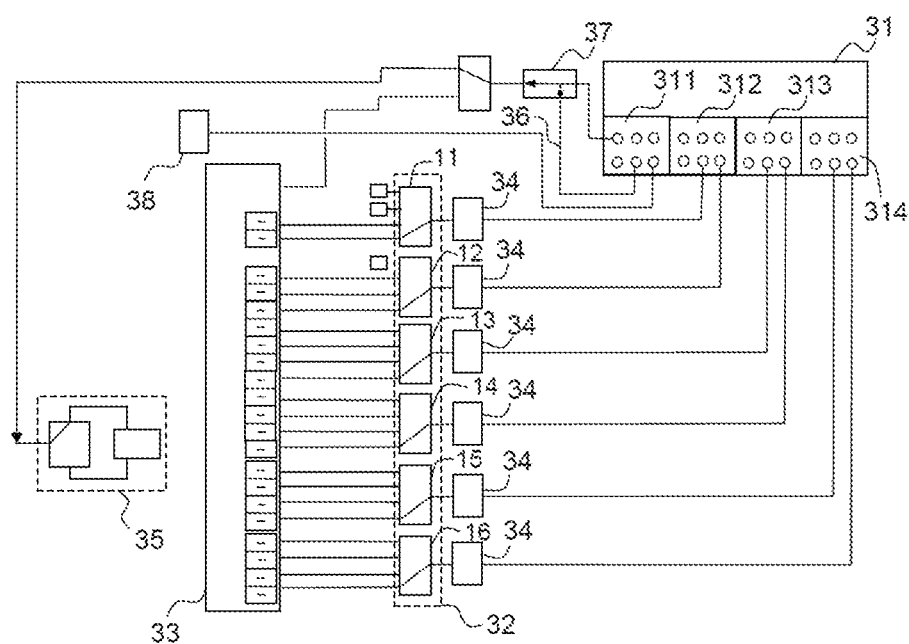
FIG. 3, an exemplary embodiment for the implementation of the method according to the invention.

FIG. 3 presents a possible exemplary embodiment of a device according to the invention. Its aim is in particular to allow simultaneous or almost simultaneous measurements of the key parameters of the CBF equation. To this end:

the response of each active channel is measured on the sum channel Σ and on its sector output in one and the same instantaneous measurement sequence, thereby minimizing the error incurred in the response difference and therefore in the term Cor_sector(i);

the responses of the M sectors on each point of the near-field mapping, plotted according to cartesian coordinates X, Y, or of the far-field pattern, plotted in polar coordinates (θ, φ), are measured in the same instantaneous measurement sequence. Under these conditions, the CBF equation sums contributions which are affected by a minimum differential error since they are measured at the same instant.

The device according to the invention comprises a multiport array analyzer 31 and set of switches 32, forming for example a switching housing, driven by the array analyzer. In the exemplary embodiment of FIG. 3, the device is compatible with the measurement of 24 signals, 21 of which arise from an antenna to be tested.

The switching housing comprises six switches 11, 12, 13, 14, 15, 16 each switching four channels onto one channel. These switches select the antenna channels 33 toward the analyzer 31. In the example of FIG. 3, four switches 13, 14, 15, 16 have their four inputs each linked to an antenna channel. A second switch 12 has three inputs each linked to an antenna channel and an input, disabled, for example linked to a load. A first switch 11 has two inputs each linked to an antenna channel and two disabled inputs, each linked for example to a load. Thus, the set of switches links 21 antenna channels to the analyzer 31. An amplifier 34 is for example disposed at the output of each switch, upstream of the analyzer, so as to amplify the measured antenna signals. This amplifier 34 is optional and can be omitted if the measurement dynamic range is sufficient.

In the example of FIG. 3, the analyzer comprises four ports 311, 312, 313, 314. Each port is formed of a transmit module and of two ports which can be rendered independent, thereby making it possible to have 8 receivers. In the example of FIG. 3, a first port 311 is used:

to generate the transmit signal intended for the probe disposed in the near field, this probe transmitting the test or reference signal to the antenna channels 33, it can be replaced with a source horn of a compact base;

with a first receiver receiving the reference signal arising from the transmit signal via a coupled channel 36, for this purpose a coupler 37 being connected at transmission output;

with a second receiver receiving a signal arising from a mini-array of radiating elements 38 allowing the monitoring of a measurement drift, this mini-array being composed of a few radiating elements of the antenna.

The other three ports 312, 313, 314 are used solely in reception to test the antenna channels.

The device according to the invention operates as described hereinafter.

The device is for example coupled to a system for motorizing the probe 35 allowing the displacement of the latter toward the various channels to be calibrated. The motorization system dispatches for example a measurement order signal, or measurement pip, to the array analyzer 31 in the following circumstances:

in the calibration phase, when the motorization system stops the probe in front of a radiating element of an active channel to be calibrated;

in near-field pattern measurement when the motorization system passes, without stopping, to a given position (X, Y) of the near-field mapping of the antenna under test;

in far-field pattern measurement when the motorization system passes, without stopping, in a given direction (θ, φ) of the radiation pattern.

On receiving this pip, the array analyzer 31 successively triggers four measurements, a measurement consisting of the simultaneous measurement of six antenna channels on the six receivers of the ports 312, 313, 314 of the analyzer. The measurements are made in the following manner:

once the signal has been received, the array analyzer 31 drives the switching box 32 so as to place each of the 6 switches on its channel 1 and then triggers the measurement on its 6 receivers for the first six channels arising from the antenna;

once this first measurement has been performed, the array analyzer drives the switching box so as to place each of the 6 switches on its channel 2, and then triggers the measurement on the other 6 channels arising from the antenna;

the other 12 antenna channels to be measured are measured in the same manner with the control of the switches on their channels 3 and 4.

In terms of measurement time and trail effect, the multi-channel system of the device according to the invention is equivalent to a system which would multiplex the measurement of 4 channels on a unique receiver and is therefore comparable to the pre-existing systems for measuring conventional antennas, thereby solving one of the problems posed.

The device, which is described for measuring 24 signals, can evolve by altering in particular:
the number of ports of simultaneous measurements of the array analyzer 31;
the number of possible positions of the switching box 32 to increase the number of consecutive measurements performed on the basis of one and the same measurement pip.

The distribution between the number of channels of the array analyzer 31 and the number of switches in the box 32 can be adapted as a function of the number of channels to be measured simultaneously. Preferentially and so as to reduce the trail effects, the array analyzer comprises the largest possible number of ports.

The measurement precision is attained by the fact that the array analyzer makes it possible to guarantee the necessary precision up to levels of −60 to −70 dBm but above all by the fact that the information that it is necessary to measure in order to use the CBF equation is measured simultaneously or almost simultaneously, and that there is no drifting of a measurement system over such short times. By way of example, in the near field between two measurement points, a time of the order of 0.5 seconds elapses and only one part of this time is used to make the 24 measurements, the major part of this time being devoted to the physical displacement from point to point.

In practice, to monitor the effects of medium-term drifting of the measurement systems, it is possible, for example, to use the following two dedicated measurements:
The measurement of the mini-array 38 as indicated previously but which does not involve the switching box, this type of monitoring conventionally being used for near-field measurement means;
A dedicated measurement, not represented by FIG. 3, can be added in order to monitor the drifting of the switching box 32 and of the optional amplification part 34. It is for example set up by diverting a part of the signal intended for the probe, in order to connect it on one of the two channels still available on the switching inputs of the box 32. Thus, at each point of measurement of the near-field mapping or of the far-field pattern, a record of this parameter is obtained, making it possible to follow the medium-term drifting, if any, of the switching/amplification assembly 32, 34.

In a near-field application, the measurement device is for example fixed and placed on a table inside an anechoic chamber. In a compact version, the device is, for example, embedded on board the mobile part of a motorized system so as to avoid having to set up a system of cables between the antenna to be calibrated and the array analyzer garnering the movements of the antenna during the measurements.

That part, illustrated by FIG. 3, of the device which is intended for the measurements is supplemented with processing and storage means for performing in particular the computations of relations (2) and (3) and for storing the calibration table of the sum channel Σ and the table of corrections to be made in order to optimize the sector channels. These means can be shared with the radar or the system coupled to the antenna. In particular, the calibration table of the Σ channel can be stored in the pointer and the table of corrections can be stored in the system which performs the CBF computations.

The invention claimed is:

1. A method for calibrating an electronic-scanning antenna composed of radiating elements each forming an active channel in which signals arising from said channels are grouped together on one hand to form deviometry signals, each deviometry signal forming a deviometry channel, and are grouped together on the other hand according to sectors ($S_1$, $S_2$, $S_M$) to form a sector-based signal forming a sector channel, a computation-based beam being formed on a basis of the signals arising from each of said sectors, comprising at least the following steps:
measuring with an analyzer a response to a calibration signal of each active channel at one and a same time on a sum deviometry channel and on the sector channel to which it belongs, responses on the sum deviometry channel making it possible to obtain the calibration of the sum deviometry channel;
computing with the analyzer, for each active channel, a disparity between a mean of the responses measured on the sum deviometry channel and a mean of the responses measured on the sector to which it belongs; and
in an operational phase, forming with a radar said beam by computation on a basis of the measurements of the signals arising from the sector channels calibrated with the calibration obtained for the sum deviometry channel, and correcting the computation of said beam as a function of said disparity.

2. The method as claimed in claim 1, wherein the measurement of the response to a calibration signal of each active channel at one and the same time on the sum deviometry channel and on the sector channel to which it belongs is performed in one and the same instantaneous measurement sequence.

3. The method as claimed in claim 1, wherein signal measurements arising from the sector channels are performed in one and the same instantaneous measurement sequence.

4. The method as claimed in claim 1, wherein the signal received by the beam formed by computation, denoted Signal_CBF, is obtained according to the following relation:

$$\text{Signal\_CBF} = \sum_{i=1}^{M} B_i e^{j\psi i} \cdot \text{Channel\_sector}(i) \cdot \text{Cor\_sector}(i)$$

where:
M is a number of sectors;
Channel_sector(i) is the measurement of the signal arising from the channel of an $i^{th}$ sector calibrated with the calibration obtained for the sum deviometry channel, i varying from 1 to M;
$B_i e^{j\psi i}$ is a complex weight assigned to the $i^{th}$ sector; and
Cor_sector(i) represents the disparity between the mean of the responses measured on the sum deviometry channel and the mean of the responses measured on the $i^{th}$ sector.

5. A measurement device for the implementation of the method as claimed in claim 1, comprising at least:
a multiport array analyzer comprising a total number P of receivers, said analyzer being able to measure the signals arising from said active channels in response to said calibration signal;
a set of K switches each having Q input channels and an output channel to which one of said input channels is wired, said switches being driven by said analyzer, said input channels being able to each receive a signal arising from an active channel of said antenna in response to said calibration signal, said output channels being linked to one of the P receivers;

said analyzer triggering successively Q measurement according to the following sequence:
- on reception of a measurement order signal, said analyzer driving said switches so that they each switch their first input channel onto their output channel and then triggering the measurement on its P receivers of the signals arising from P first active channels;
- then said analyzer driving said switches so that they each select their second input channel on their output channel, and then triggering the measurement on its P receivers of the signals arising from P following active channels;
- and so on and so forth until said analyzer driving said switches makes them each wire up their 0th input channel to their output channel.

6. The measurement device as claimed in claim 5, wherein an amplifier is disposed between each switch output and the input of the receiver to which it is linked.

7. The measurement device as claimed in claim 5, wherein a port of said analyzer comprises at least one transmit module for generating the transmit signal intended to be transmitted toward said channels.

8. The measurement device as claimed in claim 7, comprising a coupler at the output of said transmit module, said port comprising at least one receiver for receiving a reference signal arising from a transmit signal via said coupler.

9. The measurement device as claimed in claim 7, wherein said port comprises a second receiver receiving a signal arising from an array formed of a few radiating elements of said antenna.

* * * * *